US012272712B2

United States Patent
Liu et al.

(10) Patent No.: US 12,272,712 B2
(45) Date of Patent: Apr. 8, 2025

(54) CHIP PACKAGE AND METHOD FOR FORMING A CHIP PACKAGE HAVING FIRST AND SECOND STACK OF DUMMY METAL LAYERS SURROUND THE SENSING REGION

(71) Applicant: XINTEC INC., Taoyuan (TW)

(72) Inventors: Tsang-Yu Liu, Zhubei (TW); Chaung-Lin Lai, Taoyuan (TW); Shu-Ming Chang, New Taipei (TW)

(73) Assignee: Xintec Inc., Taoyuan (TW)

( * ) Notice: Subject to any disclaimer, the term of this patent is extended or adjusted under 35 U.S.C. 154(b) by 439 days.

(21) Appl. No.: 17/744,664

(22) Filed: May 14, 2022

(65) Prior Publication Data

US 2023/0369371 A1    Nov. 16, 2023

(51) Int. Cl.
*H01L 21/48* (2006.01)
*H01L 27/146* (2006.01)

(52) U.S. Cl.
CPC ...... *H01L 27/14634* (2013.01); *H01L 21/481* (2013.01); *H01L 21/4857* (2013.01); *H01L 27/14627* (2013.01); *H01L 2223/54466* (2013.01)

(58) Field of Classification Search
CPC . H01L 22/32; H01L 22/34; H01L 2223/5446; H01L 2223/54466; H01L 27/14634; H01L 21/481; H01L 21/4857

USPC .......................................................... 257/620
See application file for complete search history.

(56) References Cited

U.S. PATENT DOCUMENTS

| 2014/0077320 | A1 | 3/2014 | Chen et al. |
| 2019/0315723 | A1 | 10/2019 | Remarchuk et al. |
| 2022/0310464 | A1* | 9/2022 | Huang .................. H01L 23/562 |

OTHER PUBLICATIONS

Office Action in counterpart TW patent application No. 112117430, issued on Jun. 21, 2024.

* cited by examiner

*Primary Examiner* — Hoai V Pham
(74) *Attorney, Agent, or Firm* — LIU & LIU (57) ABSTRACT

Chip packages and methods for forming the same are provided. The method includes providing a substrate having a chip region and a scribe-line region surrounding the chip region and forming a dielectric layer on an upper surface of the substrate. A dummy structure is formed in the dielectric layer over the scribe-line region of the substrate and extends along edges of the chip region. The dummy structure includes a first stack of dummy metal layers and a second stack of dummy metal layers arranged concentrically from the inside to the outside. The method also includes performing a sawing process on a portion of the dielectric layer that surrounds the dummy structure, so as to form a saw opening through the dielectric layer. At least the first stack of dummy metal layers remains in the dielectric layer after the sawing process is performed.

15 Claims, 8 Drawing Sheets

CHIP PACKAGE AND METHOD FOR FORMING A CHIP PACKAGE HAVING FIRST AND SECOND STACK OF DUMMY METAL LAYERS SURROUND THE SENSING REGION

BACKGROUND OF THE INVENTION

Field of the Invention

The invention relates to package technology, and in particular to a chip package and a method for forming the same.

Description of the Related Art

Optoelectronic devices (e.g., image-sensing devices) play an important role in capturing images and have been widely used in electronic products such as digital cameras, digital video recorders, and mobile phones. The chip packaging process is an important step in the fabrication of electronic products. Chip packages not only protect sensing chips from outside environmental contaminants, but they also provide electrical connection paths between the electronic elements inside and those outside of the chip packages.

Typically, individual chip packages are formed by singulation using a laser process and/or a sawing process. However, the dielectric layer on the wafer (e.g., low-k dielectric material) is usually brittle, lacks mechanical strength, and is sensitive to thermal stress. Thus, debris, cracks, rough sidewalls, and other types of defects within the low-k dielectric material are likely to occur during the singulation process.

BRIEF SUMMARY OF THE INVENTION

An embodiment of the invention provides a method for forming a chip package that includes providing a substrate having a chip region and a scribe-line region surrounding the chip region and forming a dielectric layer on an upper surface of the substrate. A dummy structure is formed in the dielectric layer over the scribe-line region of the substrate and extends along edges of the chip region. The dummy structure includes a first stack of dummy metal layers and a second stack of dummy metal layers arranged concentrically from the inside to the outside. The method also includes performing a sawing process on a portion of the dielectric layer that surrounds the dummy structure, so as to form a saw opening through the dielectric layer. At least the first stack of dummy metal layers remains in the dielectric layer after the sawing process is performed.

An embodiment of the invention provides a chip package that includes: a substrate having a first surface and a second surface opposite the first surface of the substrate, and having a sensing region adjacent to the second surface of the substrate. The chip package also includes a dielectric layer having a first surface and a second surface opposite the first surface of the dielectric layer. The first surface of the dielectric layer adjoins the second surface of the substrate. The chip package further includes a dummy structure formed in the dielectric layer and adjacent to edges of the dielectric layer. The dummy structure surrounds the sensing region and includes a first stack of dummy metal layers and a second stack of dummy metal layers arranged concentrically from the inside to the outside. Additionally, the chip package includes an optical element disposed on the second surface of the dielectric layer and aligned with the sensing region.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Moreover, when a first material layer is referred to as being on or overlying a second material layer, the first material layer may be in direct contact with the second material layer, or separated from the second material layer by one or more material layers.

A chip package according to some embodiments of the present disclosure may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by a stack of a plurality of wafers having integrated circuits.

FIGS. 1A to 1E are cross-sectional views of a method for forming a chip package 10 according to some embodiments of the present disclosure. In some embodiments, the chip package 10 is implemented as a front side illumination (FSI) sensing device. However, in some other embodiments, the chip package can also be implemented as a backside illumination (BSI) sensing device or a stack of chips having a backside illumination (BSI) sensing device and other semiconductor devices.

Figure 1A:
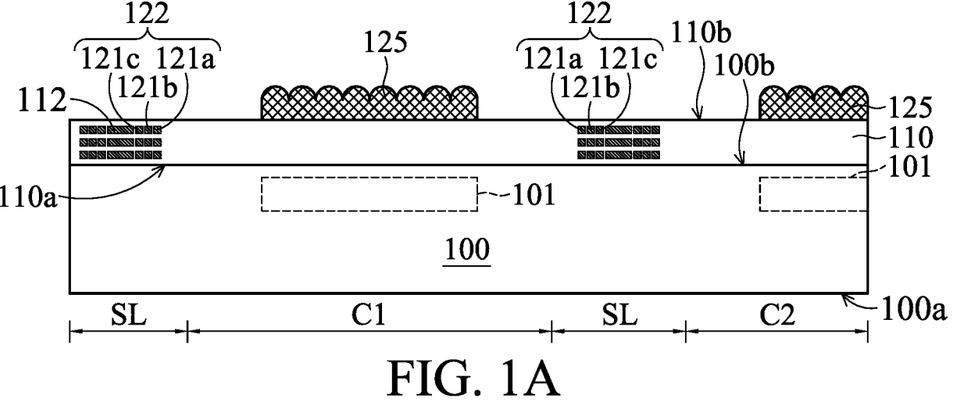
FIGS. 1A to 1E are cross-sectional views of an exemplary method for forming a chip package in accordance with some embodiments of the present disclosure.

Referring to FIG. 1A, a substrate 100 is provided. The substrate 100 has a lower surface 100a and an upper surface 100b opposite thereto, and having chip regions and a scribe-line region surrounding these chip regions and separating the adjacent chip regions. Herein, for simplicity, only a complete chip region C1, a portion of chip region C2 adjacent thereto, and a scribe-line region SL separating chip regions C1 and C2 are depicted. In other embodiments, the substrate 100 is a silicon substrate or another semiconductor substrate.

In some embodiments, each of the chip regions C1 and C2 of the substrate 100 includes a sensing region 101. Moreover, the sensing region 101 includes a sensing device (not shown), which is also adjacent to the upper surface 100b of the substrate 100. For example, the sensing region 101 includes an image-sensing device or another suitable sensing device. In some embodiments, the sensing region 101 include a device that is configured to sense biometrics (e.g., a fingerprint recognition device), a device that is configured to sense environmental characteristics (e.g., a temperature-sensing element, a humidity-sensing element, a pressure-sensing element, a capacitance-sensing element), or another suitable sensing element.

In some embodiments, a dielectric layer 110 is disposed on the upper surface 100b of the substrate 100, and the dielectric layer 110 includes an interlayer dielectric layer (ILD), an inter-metal dielectric (IMD) layer, a passivation layer or a combination thereof. Herein, to simplify the diagram, only a flat layer is depicted. In some embodiments, the sensing device within the sensing region 101 is electrically connected to each other through the interconnect structure (not shown) within the substrate 100 and the dielectric layer 110. In some embodiments, the dielectric layer 110 includes an inorganic material, such as silicon oxide, silicon nitride, silicon oxynitride, metal oxide, or a combination thereof or another suitable insulating material.

In some embodiments, one or more metal layers 112 are formed in the dielectric layer 110 and aligned with the scribe-line region SL of substrate 100. In some embodiments, the metal layer 112 may be a single layer or a multi-layer structure. For example, the metal layer 112 is a multilayer structure that includes a test key, a guard ring, or a combination thereof. Herein, for simplicity of the diagram, only some single conductive layers 112 are depicted as an example. In some embodiments, a dummy structure 122 is also formed in the dielectric layer 110 over the scribe-line region SL of the substrate 100 and adjacent to the metal layers 112. In some embodiments, the dummy structure 122 is disposed on both sides of the metal layer 112 and extends along edges of the corresponding chip region C1 or C2. The dummy structure 122 may include one or more stacks of dummy metal layers. FIGS. 2A to 2D are plan views of various exemplary configurations of the dummy structure 122 in accordance with some embodiments of the present disclosure.

Figure 2A:
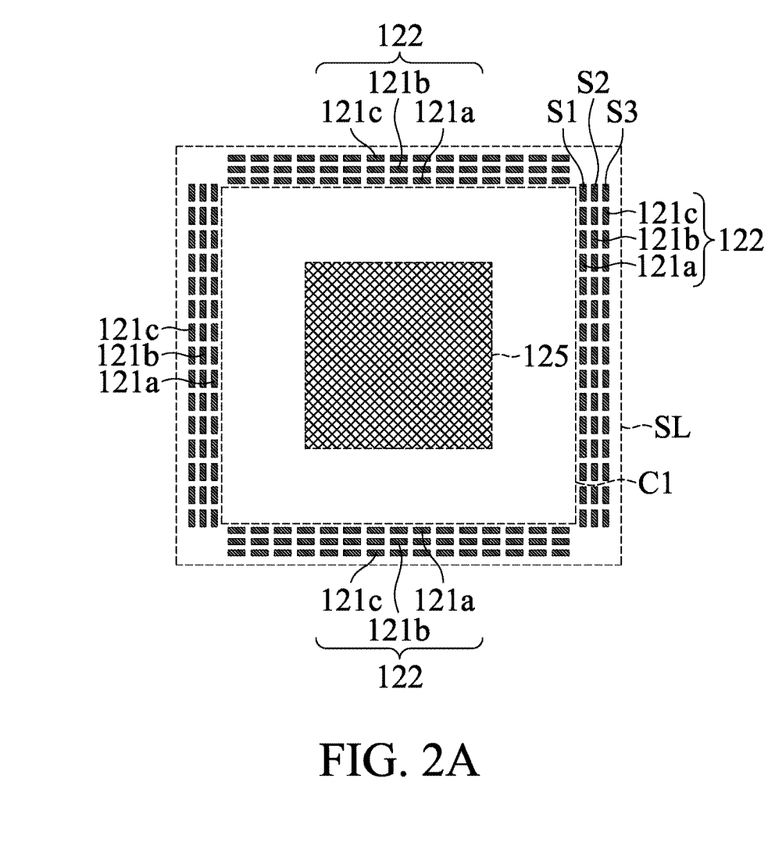
FIGS. 2A to 2D are plan views of various exemplary configurations of a dummy structure used in the formation of a chip package in accordance with some embodiments of the present disclosure.

In some embodiments, the dummy structure 122 includes a first stack 121a of dummy metal layers, a second stack 121b of dummy metal layers, and a third stack 121c of dummy metal layers arranged concentrically from the inside to the outside. In some embodiments, the first stack 121a, the second stack 121b, and the third stack 121c each includes dummy metal layers vertically stacked one by one. Those dummy metal layers may be electrically connected to each other by one or more metal vias (not shown) formed between the dummy metal layer and the overlying or underlying dummy metal layer. In some embodiments, each of the dummy metal layers in the first stack 121a, each of the dummy metal layers in the second stack 121b, and each of the dummy metal layers in the third stack 121c are discontinuous layers. The discontinuous layer in the first stack 121a includes segments S1, the discontinuous layer in the second stack 121b includes segments S2, and the discontinuous layer in the third stack 121c includes segments S3. The segments S1, S2 and S3 are in a side-by-side arrangement and substantially surround the corresponding chip region (e.g., the chip region C1 or C2) as viewed from a top-view perspective, as shown in FIG. 2A. In those cases, two ends of one segment S1 are aligned to two ends of one corresponding segment S2, respectively, and are aligned to two ends of one corresponding segment S3, respectively.

Figure 2B:
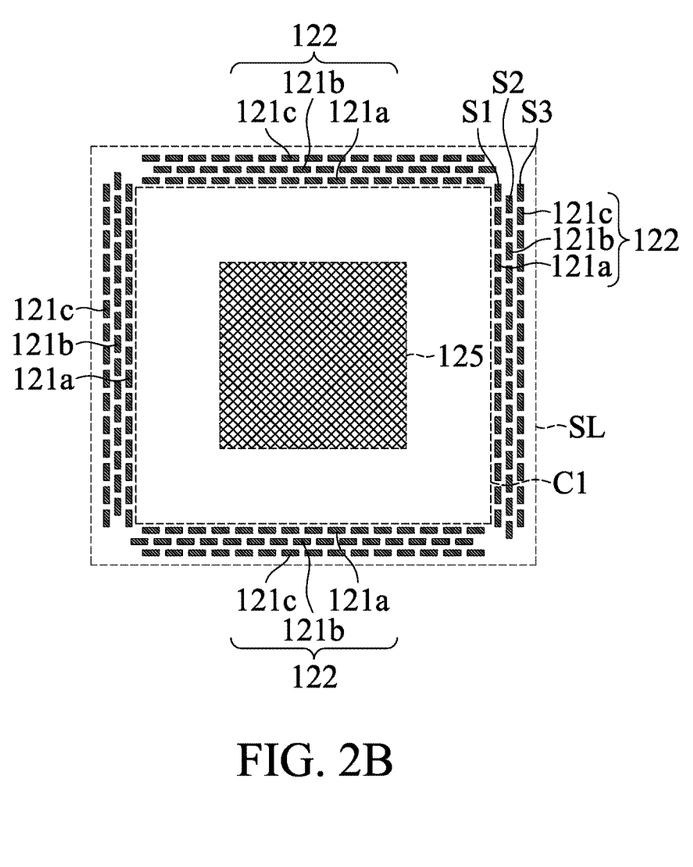

In some other embodiments, the segments S1, S2 and S3 are in a staggered arrangement and substantially surround the corresponding chip region (e.g., the chip region C1 or C2) as viewed from a top-view perspective, as shown in FIG. 2B. In those cases, two ends of one segment S1 are not aligned to two ends of one corresponding segment S2, respectively, and are aligned to two ends of one corresponding segment S3, respectively.

Figure 2C:
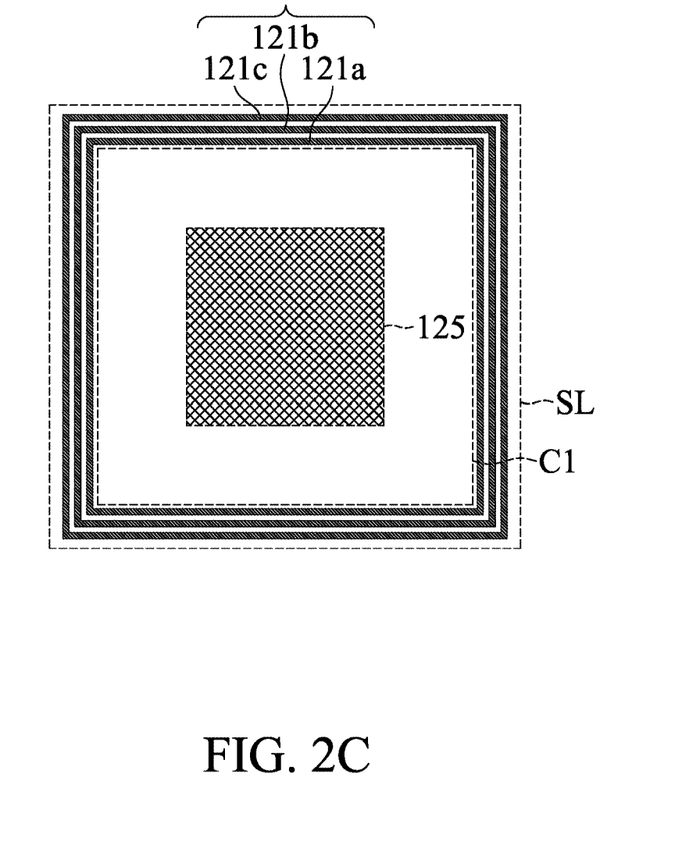

In some other embodiments, each of the dummy metal layers in the first stack 121a, each of the dummy metal layers in the second stack 121b, and each of the dummy metal layers in the third stack 121c are continuous layers that enclose the corresponding chip region (e.g., the chip region C1 or C2), as shown in FIG. 2C.

Figure 2D:
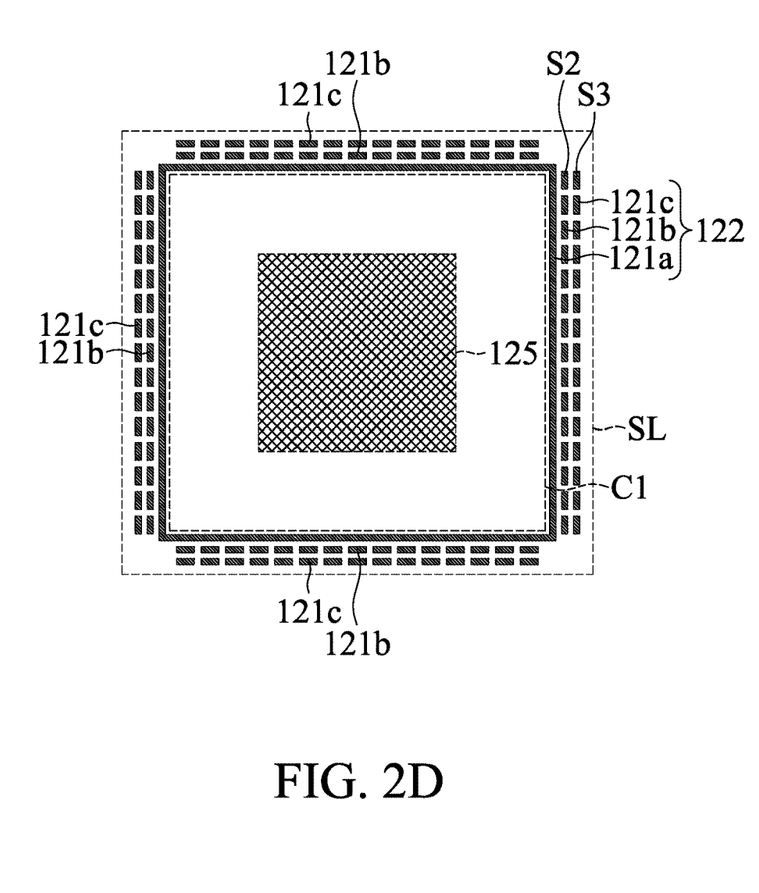

In some other embodiments, at least one of the first stack 121a, the second stack 121b, and the third stack 121c includes continuous dummy layers or discontinuous dummy layers. For example, as shown in FIG. 2D, each of the dummy metal layers in the first stack 121a is a continuous layer that encloses the corresponding chip region (e.g., the chip region C1 or C2). Unlike the each of the dummy metal layers in the first stack 121a, each of the dummy metal layers in the second stack 121b and each of the dummy metal layers in the third stack 121c is a discontinuous layer. That is, the discontinuous layer in the second stack 121b includes segments S2, and the discontinuous layer in the third stack 121c includes segments S3. The segments S2 and S3 may be in a side-by-side arrangement, as viewed from a top-view perspective, as shown in FIG. 2D. Alternatively, the segments S2 and S3 may be in a staggered arrangement, as viewed from a top-view perspective.

It is understood that the number of the dummy metal layers in the stack and the number and arrangement of the stacks in the dummy structure may depend on design requirements, and are not limited to the embodiments shown in FIGS. 2A to 2D. It is also understood that the shape of the segments may depend on design requirements, and are not limited to the embodiments shown in FIGS. 2A to 2D. For example, the segment has a circular, triangular, hexagonal, octagonal, or polygonal shape.

In some embodiments, the front end process (e.g., the formation of the sensing region 101 in the substrate 100) and the back end process (e.g., the formation of the dielectric layer 110, interconnect structure, the metal layer 112 and the dummy structure 122 on substrate 100) of the semiconductor device can be successively performed prior to the formation of the aforementioned structure. In other words, the following chip package forming method is used for the subsequent packaging process of the substrate that has completed the back end process.

In some embodiments, chip regions C1 and C2 each have an optical element 125 (e.g., microlens array, color filter, a combination thereof, or another suitable optical element) disposed on the upper surface 110b of dielectric layer 110 and aligned with the sensing region 101.

Figure 1B:
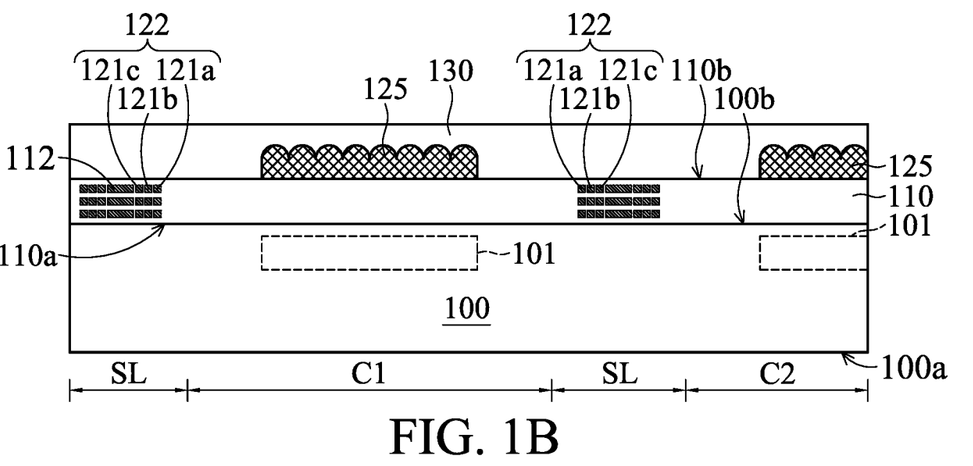

Referring to FIG. 1B, a masking layer 130 (e.g., a tape, a glue film or another suitable masking material) is formed over the upper surface 100b of the substrate 100 to completely cover the dielectric layer 110 and the optical element 125 overlying the dielectric layer 110.

Figure 1C:
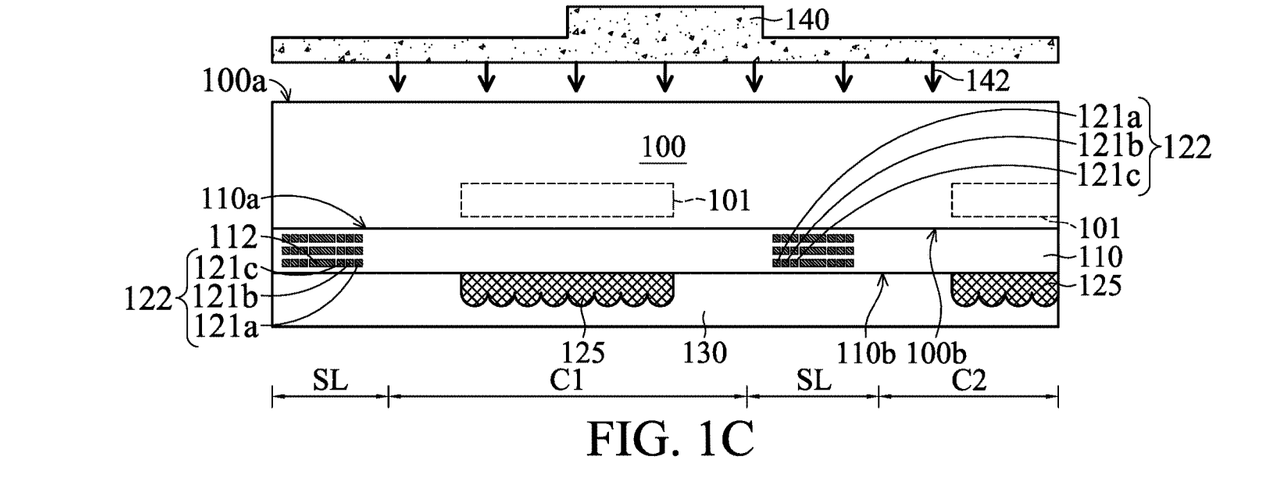

Referring to FIG. 1C, in some embodiments, after the masking layer 130 is formed, a thinning process (e.g., etching process, milling process, grinding process, or polishing process) is performed on the substrate 100 from the lower surface 100a of the substrate 100 to reduce the thickness of the substrate 100. For example, a grinding process 142 is performed on the lower surface 100a from the substrate 100 using a grinding wheel 140. In some other embodiments, the thinning process is performed prior to the formation of the masking layer 130.

Figure 1D:
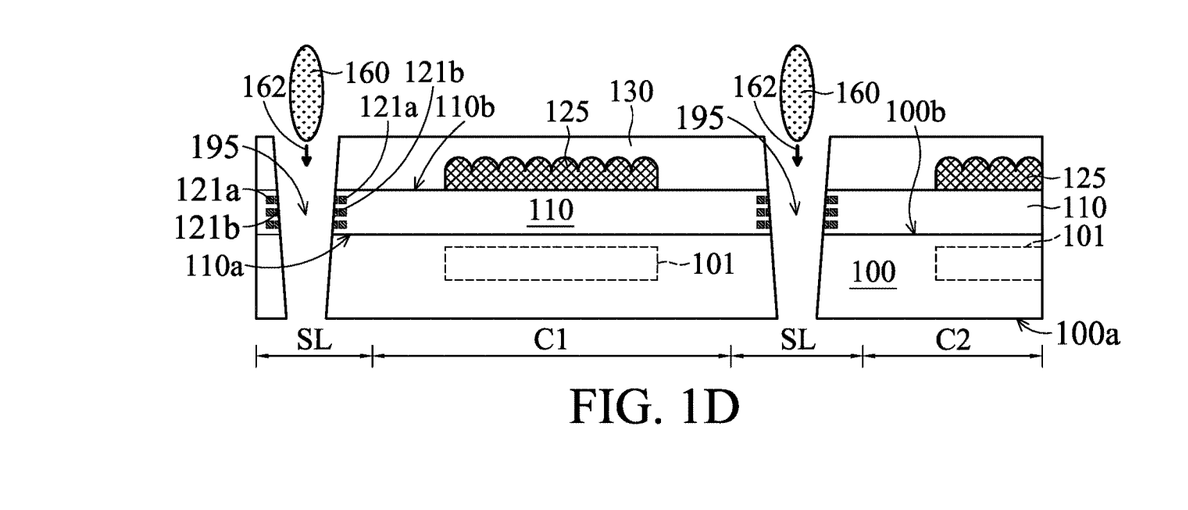

Referring to FIG. 1D, after the thinning process, a sawing process is performed on the structure shown in FIG. 1C. More specifically, the sawing process is subsequently performed on the masking layer 130, a portion of the dielectric layer 110 that surrounds the dummy structure 122 and the underlying substrate 100, so as to form a saw opening 195 through the dielectric layer 110. The sawing process 162 is performed along a direction from the upper surface 100b of the substrate 100 toward the lower surface 100a of the substrate 100 using a dicing saw 160, so that the adjacent chip regions C1 and C2 are separated from each other. In some embodiments, at least the first stack 121a of dummy metal layers remains in the dielectric layer 110 after the sawing process 162. For example, the metal layers 112 and the third stack 121c of dummy metal layers are entirely removed after the sawing process 162. Moreover, the second stack 121b of dummy metal layers are partially removed, and leave a portion of second stack 121b of dummy metal layers and the entire first stack 121a of dummy metal layers after the sawing process 162.

After sawing process 162, the saw opening 195 extends through the substrate 100, so that the adjacent chip regions C1 and C2 are separated from each other. Afterwards, the masking layer 130 is removed to expose the dielectric layer 110 and the optical element 125. For example, the masking layer 130 can be removed by a wet stripping process or another suitable stripping approaches to form the structure shown in FIG. 1E. In some embodiments, an optional clean process may be performed after the removal of the masking layer 130, so as to remove residues (if exist). As a result, an individual chip package 10 is finished.

Since the dummy structure 122 form a protective wall to block debris, cracks, or other types of defects from being formed in the portion of the dielectric layer 110 adjacent to the dummy structure 122 that are generated during the sawing process 162, the reliability of the chip package can be improved.

Figure 3A:
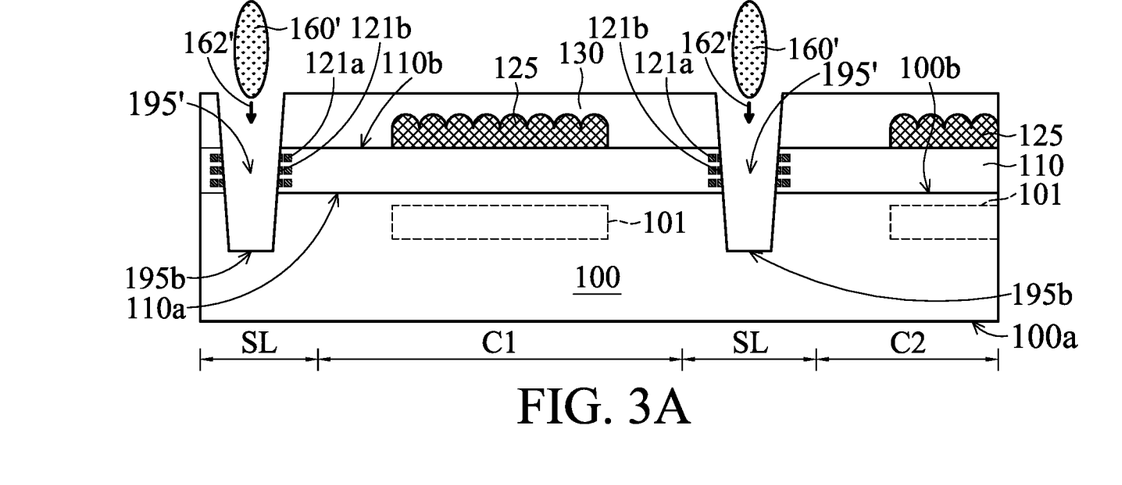
FIGS. 3A to 3C are cross-sectional views of an exemplary method for forming a chip package in accordance with some embodiments of the present disclosure.
Figure 3B:
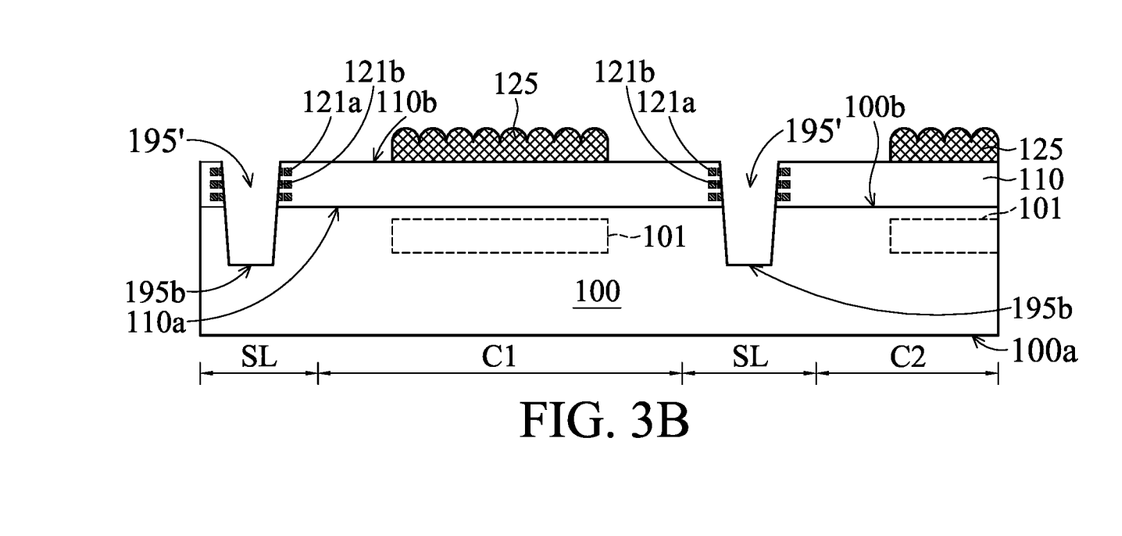
Figure 3C:
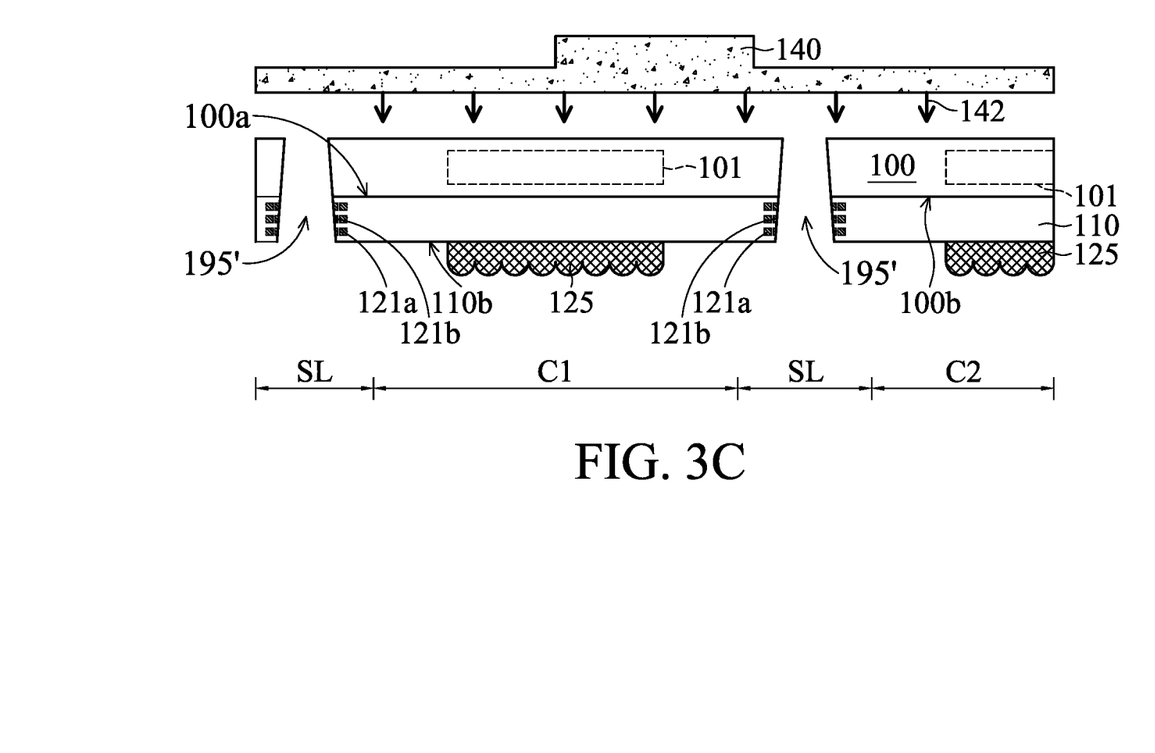

FIGS. 3A to 3C are cross-sectional views of a method for forming a chip package according to some embodiments of the present disclosure. Elements in FIGS. 3A to 3C that are the same as those in FIGS. 1A to 1E are labeled with the same reference numbers as in FIGS. 1A to 1E and may be not described again for brevity. Referring to FIG. 3A, a structure as shown in FIG. 1B is provided. Next, a sawing process is performed sequentially on the masking layer 130, the dielectric layer 110 and the substrate 100. More specifically, a sawing process 162' is performed along a direction from the masking layer 130 toward the lower surface 110a of the dielectric layer 110 using a dicing saw 160', so as to form a saw opening 195'. Unlike the saw opening 195 shown in FIG. 1D, the saw opening 195' extends into a portion of the substrate 100 after the sawing process 162', so that the bottom 195a of the saw opening 195' is within the substrate 100. That is, the bottom 195a of the saw opening 195' is located between the upper surface 100b and the lower surface 100a of the substrate 100. The formed saw opening 195' corresponds to the scribe-line region SL and surrounds chip regions C1 and C2.

In some embodiments, at least the first stack 121a of dummy metal layers remains in the dielectric layer 110 after the sawing process 162'. For example, the metal layers 112 and the third stack 121c of dummy metal layers are entirely removed after the sawing process 162'. Moreover, the second stack 121b of dummy metal layers are partially removed, and leave a portion of second stack 121b of dummy metal layers and the entire first stack 121a of dummy metal layers after the sawing process 162'.

Since the dummy structure 122 form a protective wall to block debris, cracks, or other types of defects from being formed in the portion of the dielectric layer 110 adjacent to the dummy structure 122 that are generated during the sawing process 162, the reliability of the chip package can be improved.

Referring to FIG. 3B, in some embodiments, after the saw opening 195' is formed, the masking layer 130 is removed to expose the dielectric layer 110 and optical element 125. In some embodiments, after removal of the masking layer 130, an optional clean process is performed on the structure shown in FIG. 3B to remove residues (if exist).

Figure 1E:
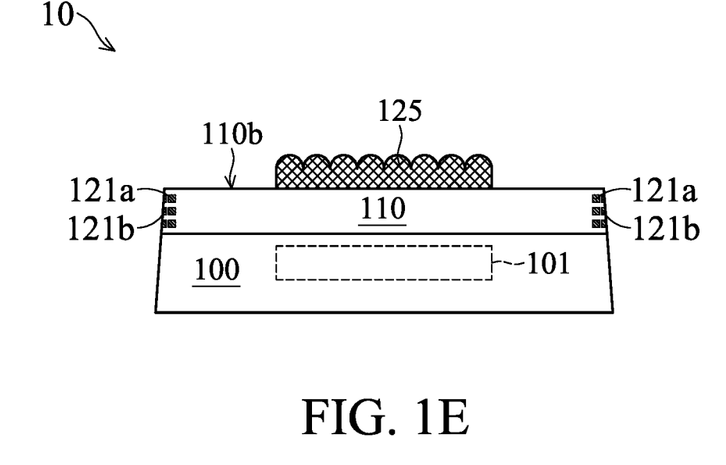

Referring to FIG. 3C, in some embodiments, after removing the masking layer 130 and performing the clean process (if present), a thinning process (e.g., etching process, milling process, grinding process, or polishing process) is performed on the substrate 100 from the lower surface 100a until the saw opening 195' is exposed. For example, a grinding process 142 is performed on the lower surface 100a from the substrate 100 using a grinding wheel 140 until the bottom 195a (as shown in FIG. 3B) of the saw opening 195' is exposed, so that the adjacent chip regions C1 and C2 are separated from each other. After the thinning process, individual chip packages can be formed as shown in FIG. 1E. In some other embodiments, the thinning process is performed prior to the removal of the masking layer 130 and the optional clean process.

Since individual chip packages can be formed after the thinning process, there is no need to perform additional sawing processes, thereby simplify the process and reducing the manufacturing cost.

Figure 4:
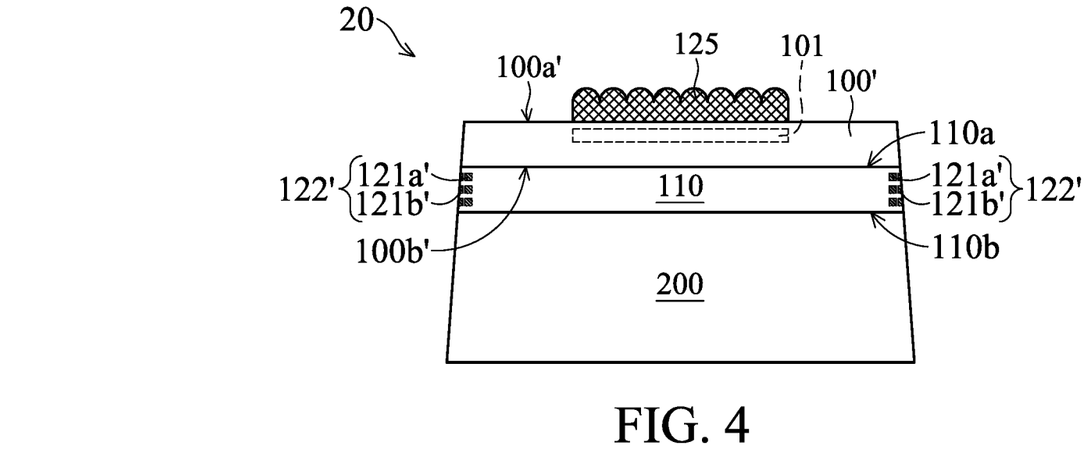
FIG. 4 is a cross-sectional view of an exemplary chip package in accordance with some embodiments of the present disclosure.

FIG. 4 is a cross-section of a chip package 20 according to some embodiments of the present disclosure. Elements in FIG. 4 that are the same as those in FIG. 1E are labeled with the same reference numbers as in FIG. 1E and may be not described again for brevity. Referring to FIG. 4, in some embodiments, the method for forming the chip package 20 is the same as or similar to the method described in FIGS. 1A to 1E or the method described in FIGS. 3A to 3C.

More specifically, the chip package 20 can be implemented as a back-illuminated (BSI) sensing device (e.g., image-sensing device) and includes: a substrate 100', a dielectric layer 110, and an optical element 125. The substrate 100' has a composition that is the same as or similar to the aforementioned substrate 100 and has a first surface (e.g., a lower surface 100a') and a second surface (e.g., an upper surface 100b') opposite the first surface of the substrate 100'. Moreover, unlike the substrate 100, the sensing region 101 in substrate 100' is adjacent to the first surface of substrate 100'. The dielectric layer 110 has a first surface (e.g., lower surface 110a) and a second surface (e.g., upper surface 110b) opposite the first surface of the dielectric layer 110, and the first surface of the dielectric layer 110 adjoins the second surface of the substrate 100'. Moreover, the optical element 125 is disposed on the first surface of the substrate 100' and is aligned with the sensing region 101 in the substrate 100' to form a back-illuminated (BSI) sensing device.

In some embodiments, a dummy structure 122' is formed in the dielectric layer 110 and adjacent to edges (or sidewalls) of the dielectric layer 110. The dummy structure 122' may include one or more stacks of dummy metal layers.

In some embodiments, the dummy structure 122' includes at least one stack of dummy metal layers. For example, the dummy structure 122' includes a first stack 121a' of dummy metal layers and a second stack 121b' of dummy metal layers arranged concentrically from the inside to the outside. In some embodiments, the first stack 121a' and the second stack 121b' each includes dummy metal layers vertically stacked one by one. Those dummy metal layers may be electrically connected to each other by one or more metal vias (not shown) formed between the dummy metal layer and the overlying or underlying dummy metal layer. In some embodiments, the sidewalls of the dielectric layer 110 are sawed surfaces formed by a sawing process. During such a sawing process, the second stack 121b' of dummy metal layers may be partially or entirely removed. For example, a portion of the second stack 121b' of dummy metal layers and the entire first stack 121a' of dummy metal layers remain in the dielectric layer 110 after the sawing process, as shown in FIG. 4.

In some embodiments, each of the dummy metal layers in the first stack 121a' and each of the dummy metal layers in the second stack 121b' are discontinuous layers. The discontinuous layers in the first stack 121a' and the second stack 121b' include segments that are in a side-by-side arrangement and substantially surround the sensing region 101 as viewed from a top-view perspective. In those cases, the arrangement of the first stack 121a' and the second stack 121b' is similar to that of first stack 121a and the second stack 121b shown in FIG. 2A. Alternatively, the discontinuous layers in the first stack 121a' and the second stack 121b' include segments that are in a staggered arrangement and substantially surround the sensing region 101 as viewed from a top-view perspective. In those cases, the arrangement of the first stack 121a' and the second stack 121b' is similar to that of first stack 121a and the second stack 121b shown in FIG. 2B.

In some other embodiments, each of the dummy metal layers in the first stack 121a' and each of the dummy metal layers in the second stack 121b' are continuous layers that enclose the sensing region 101 as viewed from a top-view perspective. In those cases, the arrangement of the first stack 121a' and the second stack 121b' is similar to that of first stack 121a and the second stack 121b shown in FIG. 2C.

In some other embodiments, the first stack 121a' and/or the second stack 121b' includes continuous dummy layers or discontinuous dummy layers. In those cases, the arrangement of the first stack 121a' and the second stack 121b' is similar to that of first stack 121a and the second stack 121b shown in FIG. 2D.

In some embodiments, the chip package 20 further includes a carrier substrate 200 adjoining the second surface (e.g., the upper surface 110b) of the dielectric layer 110. The carrier substrate 200 may be made of glass, quartz, silicon, semiconductor material, or other suitable substrate material.

Figure 5:
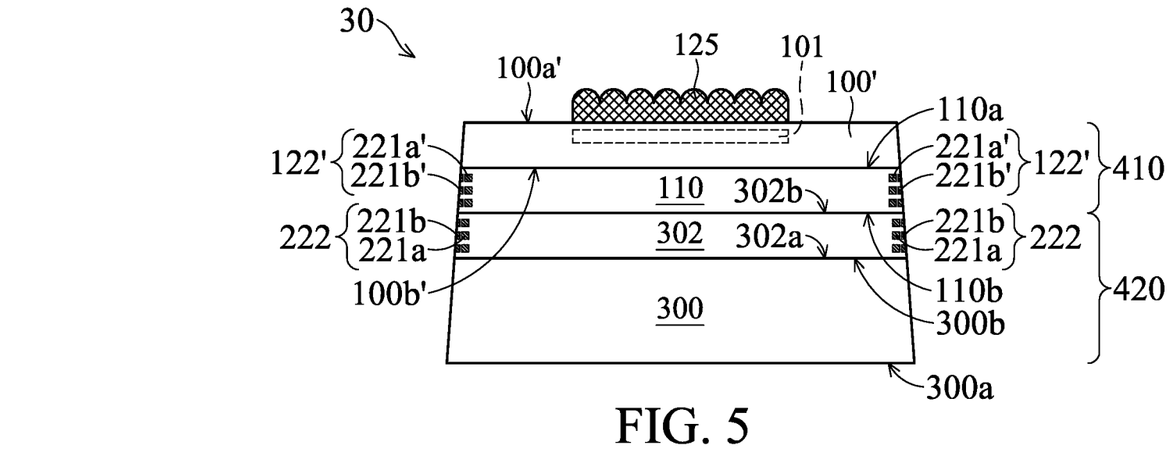
FIG. 5 is a cross-sectional view of an exemplary chip package in accordance with some embodiments of the present disclosure.

FIG. 5 is a cross-section of a chip package 30 according to some embodiments of the present disclosure. Elements in FIG. 5 that are the same as those in FIG. 4 are labeled with the same reference numbers as in FIG. 4 and may be not described again for brevity. Referring to FIG. 5, in some embodiments, the method for forming the chip package 30 is the same as or similar to the method described in FIGS. 1A to 1E or the method described in FIGS. 3A to 3C.

In some embodiments, the chip package 30 can be implemented as a chip stack of a back-illuminated (BSI) sensing device (e.g., image-sensing device) with another semiconductor device (e.g., an application-specific integrated circuit (ASIC) chip, a memory chip, or a system-on-chip (SoC)).

More specifically, the chip package 30 includes a first chip 410 and a second chip 420 stacked below the first chip 410. In some embodiments, the first chip 410 includes a substrate 100', a dielectric layer 110, and an optical element 125. Moreover, the substrate 100', the dielectric layer 110 with the dummy structure 122' (which includes a first stack 121a' of dummy metal layers and a second stack 121b' of dummy metal layers arranged concentrically from the inside to the outside) and the optical element 125 in the first wafer 410 have the same configuration and structure as those of the substrate 100', the dielectric layer 110 and the optical element 125 in the chip package 20 of FIG. 4 to form a back-illuminated (BSI) sensing device, such as a back-illuminated (BSI) image-sensing device.

In some embodiments, the second chip 420 is an application-specific integrated circuit (ASIC) chip, a memory chip, or a system-on-chip (SoC), and includes a substrate 300 and a dielectric layer 302. The substrate 300 has a first surface (e.g., lower surface 300a) and a second surface (e.g., upper surface 300b) opposite the first surface of the substrate 300. In some embodiments, the substrate 300 is a silicon substrate or another semiconductor substrate.

The dielectric layer 302 has a first surface (e.g., lower surface 302a) and a second surface (e.g., upper surface 302b) opposite the first surface of the dielectric layer 302, and the first surface and the second surface of the dielectric layer 302 adjoin the second surface (e.g., upper surface 300b) of the substrate 300 and the second surface (e.g., upper surface 110b) of the dielectric layer 110, respectively.

In some embodiments, a dummy structure 222 is formed in the dielectric layer 302. The dummy structure 222 extends along the edges (or sidewalls) of the dielectric layer 302. The dummy structure 222 may include one or more stacks of dummy metal layers.

In some embodiments, the dummy structure 222 includes at least one stack of dummy metal layers. For example, the dummy structure 222 includes a first stack 221a of dummy metal layers and a second stack 221b of dummy metal layers arranged concentrically from the inside to the outside. In some embodiments, the first stack 221a and the second stack 221b each includes dummy metal layers vertically stacked one by one. Those dummy metal layers may be electrically connected to each other by one or more metal vias (not shown) formed between the dummy metal layer and the overlying or underlying dummy metal layer. In some embodiments, the sidewalls of the dielectric layer 302 are sawed surfaces formed by a sawing process. During such a sawing process, the second stack 221b of dummy metal layers may be partially or entirely removed. For example, a portion of the second stack 221b of dummy metal layers and the entire first stack 221a of dummy metal layers remain in the dielectric layer 302 after the sawing process, as shown in FIG. 5.

In some embodiments, each of the dummy metal layers in the first stack 221a and each of the dummy metal layers in the second stack 221b are discontinuous layers. The discontinuous layers in the first stack 221a and the second stack 221b include segments that are in a side-by-side arrangement and substantially surround the sensing region 101 as viewed from a top-view perspective. In those cases, the arrangement of the first stack 221a and the second stack 221b is similar to that of first stack 121a and the second stack 121b shown in FIG. 2A. Alternatively, the discontinuous layers in the first stack 221a and the second stack 221b include segments that are in a staggered arrangement and substantially surround the sensing region 101 as viewed from a top-view perspective. In those cases, the arrangement of the first stack 221a and the second stack 221b is similar to that of first stack 121a and the second stack 121b shown in FIG. 2B.

In some other embodiments, each of the dummy metal layers in the first stack 221a and each of the dummy metal layers in the second stack 221b are continuous layers that enclose the sensing region 101 as viewed from a top-view perspective. In those cases, the arrangement of the first stack 221a and the second stack 221b is similar to that of first stack 121a and the second stack 121b shown in FIG. 2C.

In some other embodiments, the first stack 221a and/or the second stack 221b includes continuous dummy layers or discontinuous dummy layers. In those cases, the arrangement of the first stack 221a and the second stack 221b is similar to that of first stack 121a and the second stack 121b shown in FIG. 2D.

According to the aforementioned embodiments, a dummy structure is formed in the dielectric layer and corresponds to the scribe-line region. Moreover, the dummy structure extends along edges of the chip region. As a result, the dummy structure prevents debris, cracks, or other types of defects from being formed in the dielectric layer due to mechanical or thermal stresses during the sawing process. Therefore, the reliability of the chip package is increased. Additionally, individual chip packages can be formed by performing a sawing process followed by a thinning process. As a result, there is no need to perform additional sawing processes, for singulation, and therefore, the process is simplified and the manufacturing cost is thus reduced.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a substrate having a first surface and a second surface opposite the first surface of the substrate, and having a sensing region adjacent to the second surface of the substrate;
   a dielectric layer having a first surface and a second surface opposite the first surface of the dielectric layer, wherein the first surface of the dielectric layer adjoins the second surface of the substrate;
   a dummy structure formed in the dielectric layer and adjacent to edges of the dielectric layer, wherein the dummy structure surrounds the sensing region and comprises:
   a first stack of dummy metal layers and a second stack of dummy metal layers arranged concentrically from the inside to the outside; and
   an optical element disposed on the second surface of the dielectric layer and aligned with the sensing region.

2. The chip package as claimed in claim 1, wherein each of the dummy metal layers in the first stack and each of the dummy metal layers in the second stack is a continuous layer that surrounds the sensing region.

3. The chip package as claimed in claim 1, wherein each of the dummy metal layers in the first stack is a continuous layer that surrounds the sensing region, and each of the dummy metal layers in the second stack is a discontinuous layer.

4. The chip package as claimed in claim 1, wherein each of the dummy metal layers of the first stack and each of the dummy metal layers of the second stack is a discontinuous layer.

5. A chip package, comprising:
   a first chip, comprising:
   a first substrate having a first surface and a second surface opposite the first surface of the first substrate, and having a sensing region adjacent to the first surface of the substrate;
   a first dielectric layer having a first surface and a second surface opposite the first surface of the first dielectric layer, wherein the first surface of the first dielectric layer adjoins the second surface of the first substrate;
   a first dummy structure formed in the first dielectric layer and adjacent to edges of the first dielectric layer, wherein the first dummy structure surrounds the sensing region and comprises:
   a first stack of dummy metal layers and a second stack of dummy metal layers arranged concentrically from the inside to the outside; and
   an optical element disposed on the first surface of the first substrate and aligned with the sensing region.

6. The chip package as claimed in claim 5, further comprising a carrier substrate adjoining the second surface of the first dielectric layer.

7. The chip package as claimed in claim 5, wherein each of the dummy metal layers in the first stack and each of the dummy metal layers in the second stack is a continuous layer that surrounds the sensing region.

8. The chip package as claimed in claim 5, wherein each of the dummy metal layers in the first stack is a continuous layer that surrounds the sensing region, and each of the dummy metal layers in the second stack is a discontinuous layer.

9. The chip package as claimed in claim 5, wherein each of the dummy metal layers of the first stack and each of the dummy metal layers of the second stack is a discontinuous layer.

10. The chip package as claimed in claim 5, further comprising:

a second chip disposed below the first chip, comprising:
a second substrate having a first surface and a second surface opposite the first surface of the second substrate;
a second dielectric layer having a first surface and a second surface opposite the first surface of the second dielectric layer, and the first surface and the second surface of the second dielectric layer respectively adjoining the second surface of the second substrate and the second surface of the first dielectric layer; and
a second dummy structure formed in the first dielectric layer and adjacent to edges of the second dielectric layer, wherein the second dummy structure surrounds the sensing region and comprises:
a third stack of dummy metal layers and a fourth stack of dummy metal layers arranged concentrically from the inside to the outside.

11. The chip package as claimed in claim 10, wherein each of the dummy metal layers in the third stack and each of the dummy metal layers in the fourth stack is a continuous layer that surrounds the sensing region.

12. The chip package as claimed in claim 10, wherein each of the dummy metal layers in the third stack is a continuous layer that surrounds the sensing region, and each of the dummy metal layers in the fourth stack is a discontinuous layer.

13. The chip package as claimed in claim 10, wherein each of the dummy metal layers of the third stack and each of the dummy metal layers of the fourth stack is a discontinuous layer.

14. The chip package as claimed in claim 10, wherein the first chip comprises an image-sensing device.

15. The chip package as claimed in claim 10, wherein the second chip is an application-specific integrated circuit chip, a memory chip, or a system-on-chip.

* * * * *